United States Patent
Wagner et al.

(10) Patent No.: US 10,090,640 B2
(45) Date of Patent: Oct. 2, 2018

(54) PULSE-WIDTH MODULATION LIGHT SOURCE DRIVE AND METHOD

(71) Applicant: Raytheon Canada Ltd., Ottawa (CA)

(72) Inventors: Kevin B. Wagner, Wyevale (CA); Ryan Nobes, New Lowell (CA)

(73) Assignee: Raytheon Canada Ltd., Ottawa (CA)

( * ) Notice: Subject to any disclaimer, the term of this patent is extended or adjusted under 35 U.S.C. 154(b) by 0 days.

(21) Appl. No.: 15/481,327

(22) Filed: Apr. 6, 2017

(65) Prior Publication Data

US 2018/0034241 A1    Feb. 1, 2018

Related U.S. Application Data (63) Continuation of application No. PCT/CA2016/050896, filed on Jul. 29, 2016.

(51) Int. Cl.
*H05B 33/08* (2006.01)
*H01S 5/0683* (2006.01)

(52) U.S. Cl.
CPC ..... *H01S 5/06835* (2013.01); *H05B 33/0812* (2013.01); *H05B 33/0818* (2013.01); *H05B 33/0851* (2013.01)

(58) Field of Classification Search
None
See application file for complete search history.

(56) References Cited

U.S. PATENT DOCUMENTS

2009/0189539 A1* 7/2009 Deng ................. H05B 33/0812
315/294
2010/0019687 A1  1/2010 Komiya et al.
(Continued)

FOREIGN PATENT DOCUMENTS

| CA | 2575578 A1 | 9/2005 |
| CA | 2575578 A1 | 5/2006 |

(Continued)

OTHER PUBLICATIONS

Foreign Communication from Related Counterpart Application; European Patent Application No. 16880190.0; Extended European Search Report and European Search Opinion dated Dec. 20, 2017; 18 pages.

(Continued)

*Primary Examiner* — Jany Richardson (57) ABSTRACT

A pulse-width modulation (PWM) light source drive for driving a light source is provided that includes a microcontroller, a modulation element, a voltage regulator, and a light detector. The microcontroller is configured to generate a PWM signal and an inverse PWM signal. The modulation element is configured to generate a drive signal based on the PWM signal. The light source is configured to be driven by the drive signal. The voltage regulator is configured to generate an output drive voltage for the light source. The light detector is configured to detect light energy emitted by the light source, to generate an optical power feedback signal based on the detected light energy, and to provide the optical power feedback signal to the voltage regulator during a laser-on driving interval. The microcontroller is configured to provide the inverse PWM signal to the voltage regulator during a laser-off driving interval. The voltage regulator is configured to adjust the output drive voltage based on the optical power feedback signal during the laser-on driving interval and based on the inverse PWM signal during the laser-off driving interval.

20 Claims, 6 Drawing Sheets

(56) References Cited

U.S. PATENT DOCUMENTS

| | | | |
|---|---|---|---|
| 2014/0159614 A1* | 6/2014 | Hussain | H05B 33/086 |
| | | | 315/307 |
| 2014/0354150 A1 | 12/2014 | Joseph et al. | |
| 2015/0115830 A1* | 4/2015 | Siessegger | H05B 33/0803 |
| | | | 315/291 |
| 2015/0351190 A1* | 12/2015 | Walters | H05B 33/0815 |
| | | | 315/186 |

FOREIGN PATENT DOCUMENTS

| | | |
|---|---|---|
| EP | 2495831 A1 | 9/2012 |
| WO | 2006047014 A1 | 5/2006 |

OTHER PUBLICATIONS

Notification of Transmittal of the International Search Report and the Written Opinion of the International Searching Authority, or the Declaration dated Apr. 28, 2017 in connection with International Patent Application No. PCT/CA2016/050896.

\* cited by examiner

PULSE-WIDTH MODULATION LIGHT SOURCE DRIVE AND METHOD

CROSS-REFERENCE TO RELATED APPLICATION AND PRIORITY CLAIM

This application is a continuation of International Patent Application No. PCT/CA2016/050896 filed on Jul. 29, 2016, which is hereby incorporated by reference in its entirety.

TECHNICAL FIELD

The present disclosure is directed, in general, to light source drive technology and, more specifically, to a pulse-width modulation (PWM) light source drive and method.

BACKGROUND OF THE DISCLOSURE

Semiconductor laser diodes are usually required to be driven in a constant optical power mode in order to maintain wavelength stability, wavelength purity, and stability in their optical power for the corresponding application. Conventional laser drives monitor either an internal or an external photodiode and include a closed-loop circuit that is used to adjust the drive to the laser in order to maintain the optical power. These systems generally work well in a continuous drive mode (e.g., DC). However, when the power has to be modulated, the conventional method implements pulse-width modulation of the drive. The circuitry used to perform PWM typically has high bandwidth requirements due to the frequency content of the pulses.

SUMMARY OF THE DISCLOSURE

This disclosure provides a PWM light source drive and method.

In one embodiment, a PWM light source drive for driving a light source is provided that includes a microcontroller, a modulation element, a voltage regulator, and a light detector. The microcontroller is configured to generate a PWM signal and an inverse PWM signal. The modulation element is configured to generate a drive signal based on the PWM signal. The light source is configured to be driven by the drive signal. The voltage regulator is configured to generate an output drive voltage for the light source. The light detector is configured to detect light energy emitted by the light source, to generate an optical power feedback signal based on the detected light energy, and to provide the optical power feedback signal to the voltage regulator during a laser-on driving interval. The microcontroller is configured to provide the inverse PWM signal to the voltage regulator during a laser-off driving interval. The voltage regulator is configured to adjust the output drive voltage based on the optical power feedback signal during the laser-on driving interval and based on the inverse PWM signal during the laser-off driving interval In another embodiment, a PWM laser drive for driving a laser diode is provided that includes a microcontroller, a modulation element, a voltage regulator, and a photodiode. The microcontroller is configured to generate a PWM signal and an inverse PWM signal. The modulation element is configured to generate a drive signal based on the PWM signal. The laser diode is configured to be driven by the drive signal. The voltage regulator is configured to generate an output drive voltage for the laser diode based on an internal regulator reference. The photodiode is configured to detect light energy emitted by the laser diode, to generate an optical power feedback signal based on the detected light energy, and to provide the optical power feedback signal to the voltage regulator during a laser-on driving interval. The microcontroller is configured to provide the inverse PWM signal to the voltage regulator during a laser-off driving interval. The voltage regulator is configured to adjust the output drive voltage based on the optical power feedback signal during the laser-on driving interval and based on the inverse PWM signal during the laser-off driving interval.

In yet another embodiment, a method for driving a light source using a PWM light source drive is provided that includes modulating a drive signal for the light source with a PWM signal. An inverse PWM signal is generated based on the PWM signal. An output drive voltage is generated based on an internal regulator reference. The output drive voltage is provided to the light source. Light energy emitted from the light source is detected. An optical power feedback signal is generated based on the detected light energy. The optical power feedback signal is provided as a feedback signal to the voltage regulator when the current driving interval is a laser-on driving interval. The inverse PWM signal is provided as the feedback signal to the voltage regulator when the current driving interval is a laser-off driving interval. The output drive voltage is adjusted based on the feedback signal.

Other technical features may be readily apparent to one skilled in the art from the following figures, descriptions, and claims.

BRIEF DESCRIPTION OF THE DRAWINGS

For a more complete understanding of the present disclosure, reference is now made to the following description taken in conjunction with the accompanying drawings, in which.

DETAILED DESCRIPTION

FIGS. 1 through 4, discussed below, and the various embodiments used to describe the principles of the present disclosure in this patent document are by way of illustration only and should not be construed in any way to limit the scope of the disclosure. Those skilled in the art will understand that the principles of the present disclosure may be implemented using any number of techniques, whether currently known or not. Additionally, the drawings are not necessarily drawn to scale.

Figure 1:
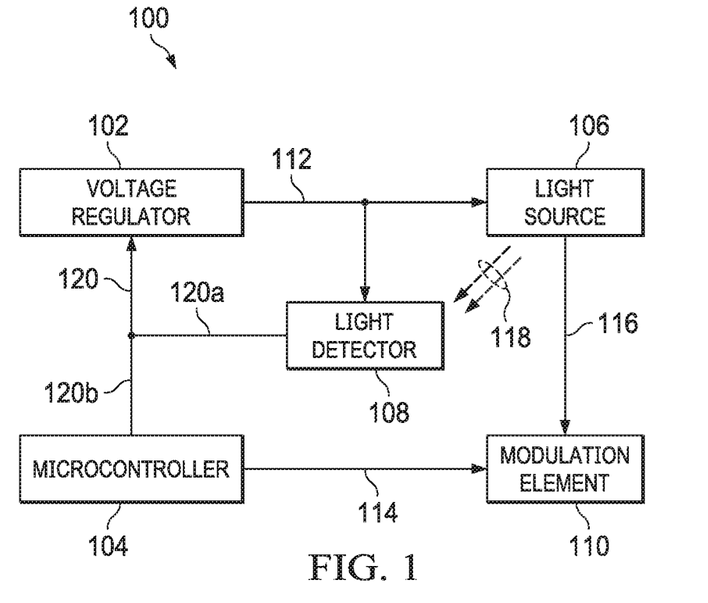
FIG. 1 illustrates a PWM light source drive in accordance with the present disclosure.

FIG. 1 illustrates a pulse-width modulation (PWM) light source drive 100 according to an embodiment of this disclosure. The embodiment of the PWM light source drive 100 shown in FIG. 1 is for illustration only. Other embodiments of the PWM light source drive 100 could be used without departing from the scope of this disclosure.

The PWM light source drive 100 includes a voltage regulator 102, a microcontroller 104, a light source 106, a light detector 108 and a modulation element 110. The voltage regulator 102 may include a switching-type or linear-type voltage regulator. The voltage regulator 102 is configured to generate an output drive voltage 112 based on an internal regulator reference and a feedback voltage 120 and to provide the output drive voltage 112 to the light source 106 and a bias voltage to the light detector 108. The microcontroller 104 may include any suitable type of controller. The microcontroller 104 is configured to generate a PWM signal 114 and to provide the PWM signal 114 to the modulation element 110. The modulation element 110 may include a metal-oxide-semiconductor field-effect transistor (MOSFET) or other suitable type of transistor or modulation device. The modulation element 110 is configured to generate a drive signal 116 based on the PWM signal 114 and to drive the light source 106 via the drive signal 116.

The light source 106 may include a laser, a light-emitting diode (LED) or other suitable type of device configured to produce light. The light source 106 is configured to emit light energy 118 based on the drive signal 116. The light detector 108 may include a photodiode or other suitable type of device configured to detect light. The light detector 108 is configured to monitor the power output by the light source 106. Thus, the light detector 108 is configured to detect the light energy 118 emitted by the light source 106, to generate an optical power feedback signal 120a based on the light energy 118, which is associated with the optical power output of the light source 106, and to provide the optical power feedback signal 120a to the voltage regulator 102. The microcontroller 104 is configured to generate an inverse PWM signal 120b that is an inverse of the PWM signal 114 and to provide the inverse PWM signal 120b to the voltage regulator 102.

As described in more detail below, during a laser-on driving interval, the light detector 108 is configured to provide the optical power feedback signal 120a as the feedback signal 120 to the voltage regulator 102. During a laser-off driving interval, the microcontroller 104 is configured to provide the inverse PWM signal 120b as the feedback signal 120 to the voltage regulator 102. Thus, the feedback signal 120 provided to the voltage regulator 102 includes either the optical power feedback signal 120a or the inverse PWM signal 120b. The voltage regulator 102 is configured to adjust the output drive voltage 112, if an adjustment is indicated, based on the feedback signal 120 received from the light detector 108 or the microcontroller 104.

By synthesizing a feedback signal 120 through the inverse PWM signal 120b during the laser-off driving interval, the PWM light source drive 100 is able to keep the voltage regulator 102 stable during PWM off time. Thus, the PWM light source drive 100 may generate a stable output without a demanding bandwidth requirement for the voltage regulator 102. In this way, the PWM light source drive 100 may provide a stable, relatively constant optical power to the light source 106 while implementing PWM intensity control.

Although FIG. 1 illustrates one example of a PWM light source drive 100, various changes may be made to the embodiment of FIG. 1. For example, various components of the PWM light source drive 100 could be combined, further subdivided, moved, or omitted and additional components could be added according to particular needs. As a specific example, the light source 106 may be externally coupled to the PWM light source drive 100.

Figure 2:
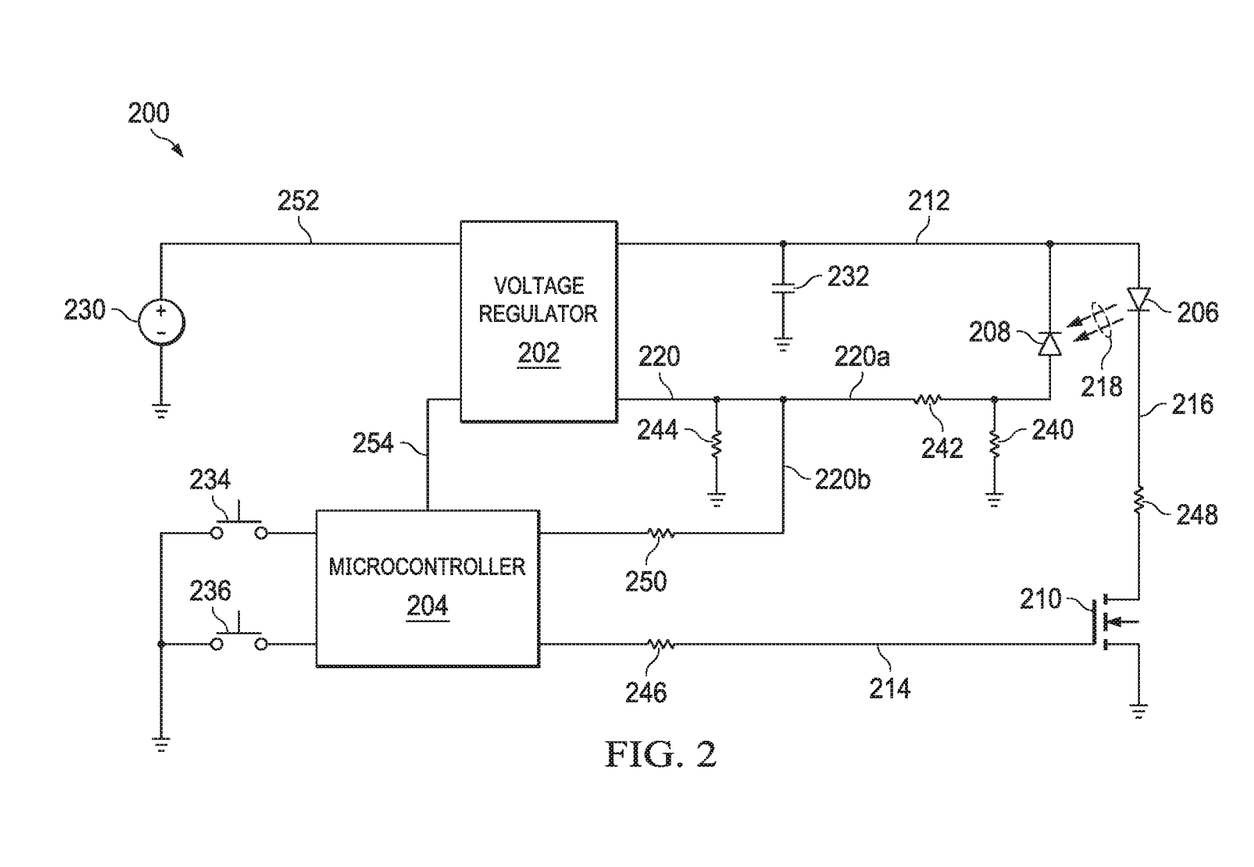
FIG. 2 illustrates a PWM laser drive in accordance with an embodiment of the present disclosure.

FIG. 2 illustrates a PWM laser drive 200 in accordance with an embodiment of the present disclosure. The embodiment of the PWM laser drive 200 shown in FIG. 2 is for illustration only. Other embodiments of the PWM laser drive 200 could be used without departing from the scope of this disclosure.

For the embodiment illustrated in FIG. 2, the PWM laser drive 200 includes a voltage regulator 202, a microcontroller 204, a laser diode 206, photodiode 208 and a MOSFET 210, in addition to a DC supply voltage generator 230, an output capacitor 232, an up switch 234, a down switch 236, and resistors 240, 242, 244, 246, 248 and 250. For a particular embodiment, the voltage regulator 202 may include a switching-type voltage regulator, such as a TLV61220 voltage regulator made by Texas Instruments. However, the voltage regulator 202 may include any other suitable type of voltage regulator.

The voltage regulator 202 is configured to generate an output drive voltage 212 at the output capacitor 232 based on an internal regulator reference in the voltage regulator 202 and a feedback signal 220. The voltage regulator 202 is also configured to provide the output drive voltage 212 to the laser diode 206 and a bias voltage to the photodiode 208.

The microcontroller 204 may include any suitable type of controller. The microcontroller 204 is configured to generate an enable signal 254 and to provide the enable signal 254 to the voltage regulator 202 in order to enable operation of the voltage regulator 202. The microcontroller 204 is also configured to generate a PWM signal 214 and to provide the PWM signal 214 to the MOSFET 210. The PWM signal 214 may include a 10-bit resolution duty cycle or other suitable resolution duty cycle.

The MOSFET 210 is configured to generate a drive signal 216 based on the PWM signal 214 and to drive the laser diode 206 via the drive signal 216. Thus, the MOSFET 210 is configured to pulse current through the laser diode 206 based on the PWM signal 214.

The laser diode 206 is configured to emit light energy 218 based on the drive signal 216. The photodiode 208 is configured to monitor the power output by the laser diode 206. Thus, the photodiode 208 is configured to detect the light energy 218 emitted by the laser diode 206, to generate an optical power feedback signal 220a based on the light energy 218, which is associated with the optical power output of the laser 208, and to provide the optical power feedback signal 220a to the voltage regulator 202. The microcontroller 204 is configured to generate an inverse PWM signal 220b that is an inverse of the PWM signal 214 and to provide the inverse PWM signal 220b to the voltage regulator 202.

As described in more detail below, during a laser-on driving interval, the photodiode 208 is configured to provide the optical power feedback signal 220a as the feedback signal 220 to the voltage regulator 202. During a laser-off driving interval, the microcontroller 204 is configured to provide the inverse PWM signal 220b as the feedback signal 220 to the voltage regulator 202. Thus, the feedback signal 220 provided to the voltage regulator 202 includes either the optical power feedback signal 220a or the inverse PWM signal 220b.

The voltage regulator 202 is configured to adjust the output drive voltage 212, if an adjustment is indicated, based on the feedback signal 220 received from the photodiode 208 or the microcontroller 204. The feedback signal 220 provides a scaled voltage to the voltage regulator 202 such that the voltage regulator 202 increases the output drive voltage 212 if the scaled voltage provided by the feedback signal 220 is less than a specified value and decreases the output drive voltage 212 if the scaled voltage provided by the feedback signal 220 is more than the specified value. For example, for a particular embodiment, the specified value may be 0.5 V. In this way, the voltage regulator 202 is configured to provide a relatively steady DC output voltage as the output drive voltage 212.

In operation, during the laser-on driving interval, the laser diode 206 is driven on and the photodiode 208 produces the optical power feedback signal 220a through the resistor 240. The resistor 240 is scaled to the other resistors 242, 244, 246, 248 and 250 in the resistive network, and the voltage of the optical power feedback signal 220a is scaled to produce an optical power that satisfies the control loop of the PWM laser drive 200. Scaling of the resistors 240, 242, 244, 246, 248 and 250 in this network may be used to set the optical power. During this laser-on driving interval, if the temperature of the PWM laser drive 200 changes or the efficiency of the laser diode 206 changes, the voltage of the feedback signal 220 will change, resulting in the output drive voltage 212 being adjusted accordingly to keep the PWM laser drive 200 operating at a relatively constant optical power.

During the laser-off driving interval, the photodiode 208 provides no feedback. To prevent the voltage regulator 202 from shutting down and to maintain stability during this driving interval, the microcontroller 204 provides the inverse PWM signal 220b through the resistor 250 as the feedback signal 220 to the voltage regulator 202.

The up switch 234 is configured to allow the microcontroller 204 to be commanded to increase the PWM duty cycle of the MOSFET 210, and the down switch 236 is configured to allow the microcontroller 204 to be commanded to decrease the PWM duty cycle of the MOSFET 210.

By synthesizing a feedback signal 220 through the inverse PWM signal 220b during the laser-off driving interval, the PWM laser drive 200 is able to keep the voltage regulator 202 stable during PWM off time. Thus, the PWM laser drive 200 may generate a stable output without a demanding bandwidth requirement for the voltage regulator 202, allowing the PWM laser drive 200 to provide a range of brightness control for the laser diode 206 through a wide dynamic range of modulation. In this way, the PWM laser drive 200 may provide a stable, relatively constant optical power to the laser diode 206 while implementing PWM intensity control.

Although FIG. 2 illustrates an example of the PWM laser drive 200, various changes may be made to the embodiment of FIG. 2. For example, various components could be combined, further subdivided, moved, or omitted and additional components could be added according to particular needs. As a specific example, the laser diode 206 may be externally coupled to the PWM laser drive 200. As another example, the MOSFET 210 may be replaced by any other suitable type of transistor.

Figure 3A:
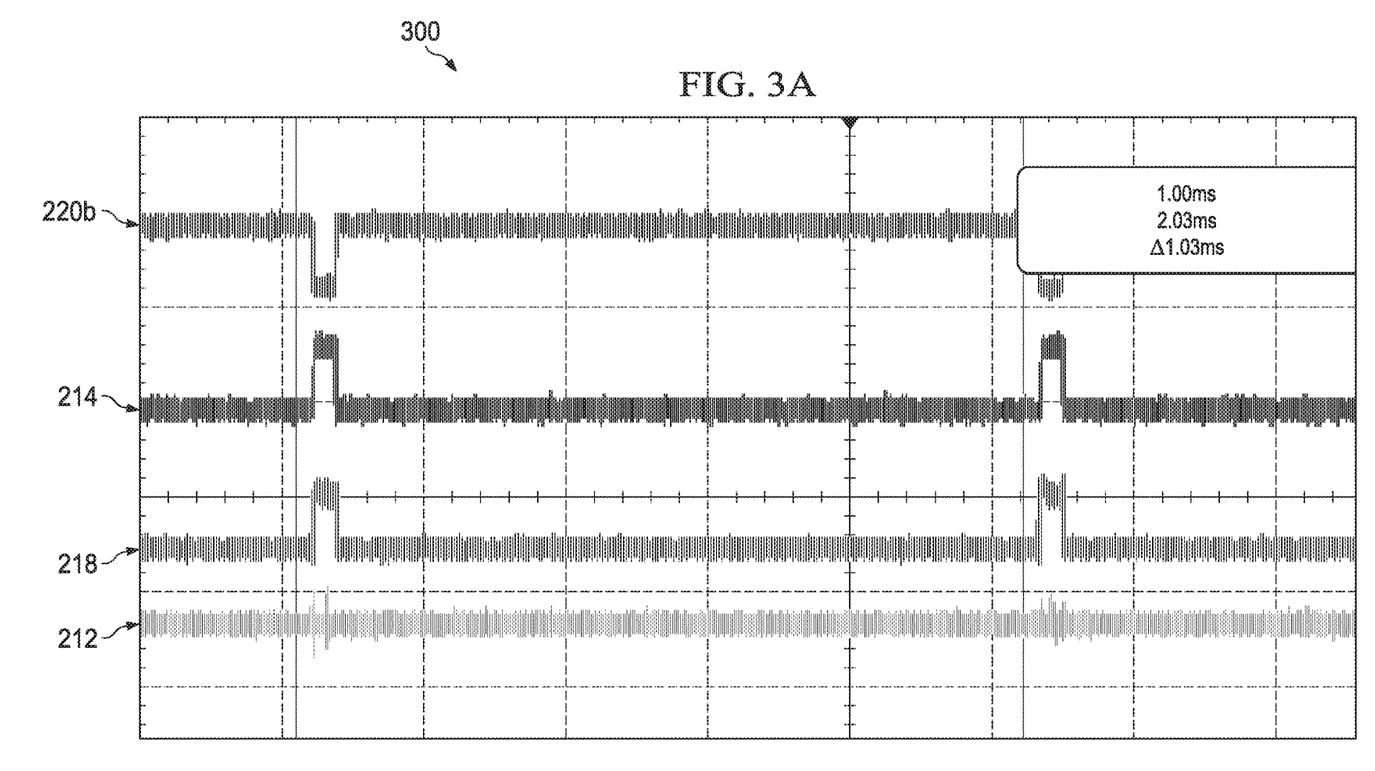
FIGS. 3A-C are graphs illustrating the outputs of the PWM laser drive of FIG. 2 in accordance with an embodiment of the present disclosure.
Figure 3B:
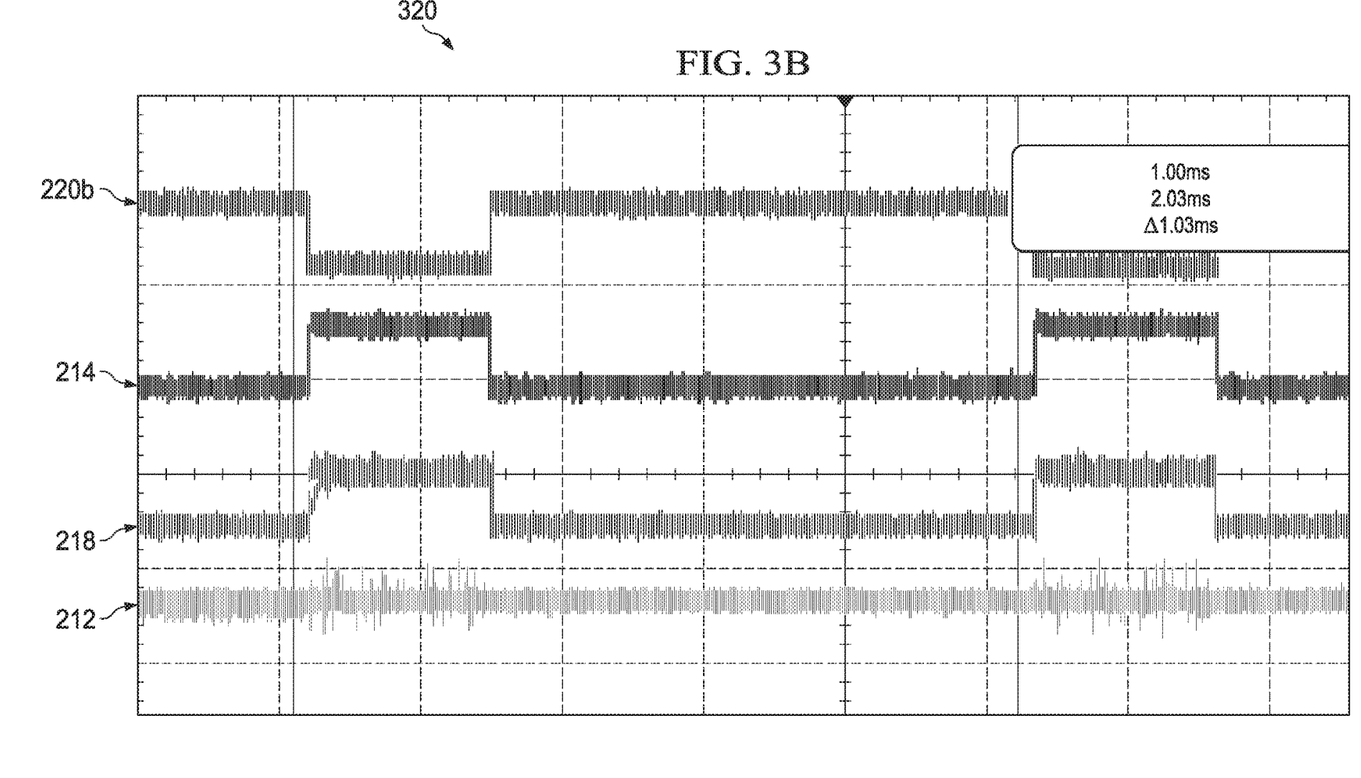
Figure 3C:
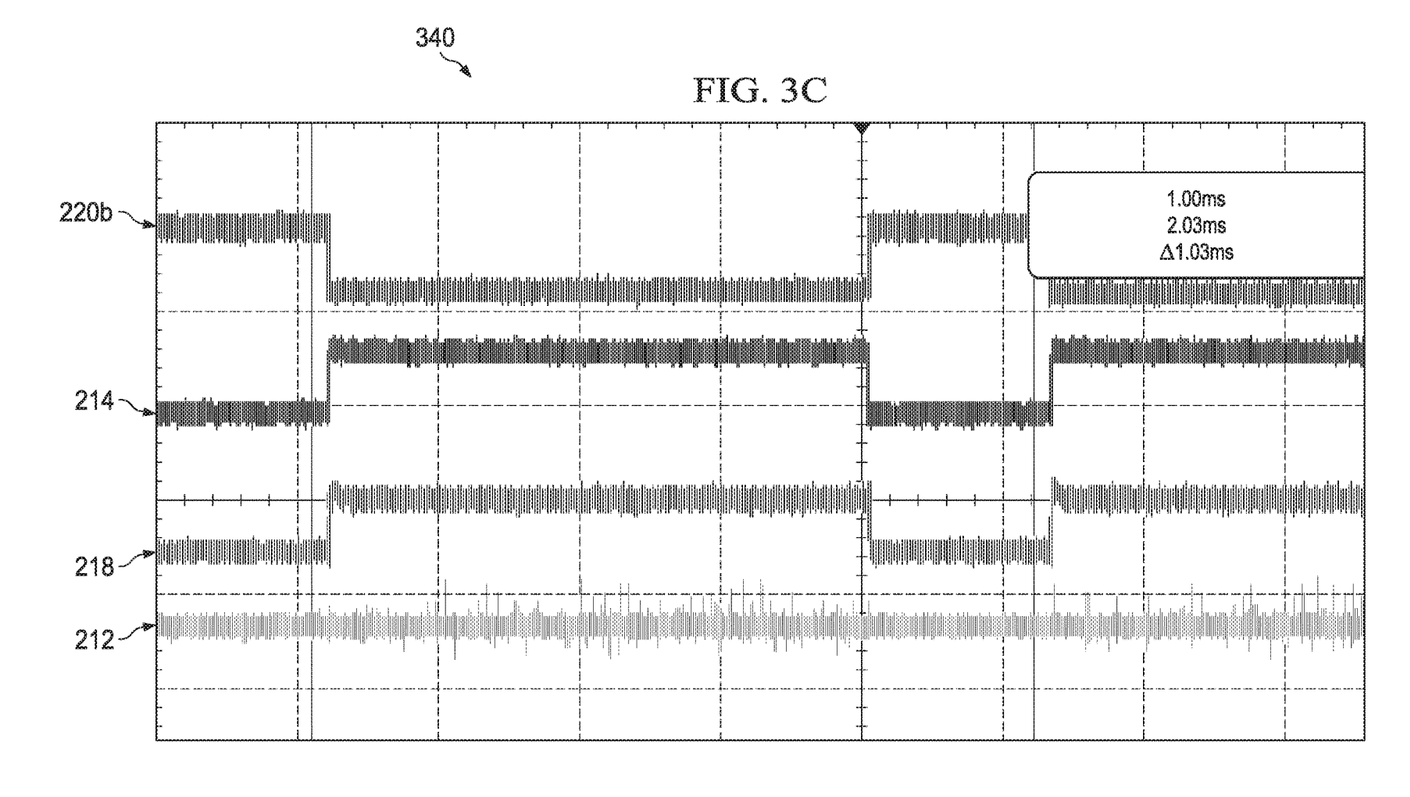

FIGS. 3A-C are graphs 300, 320 and 340 illustrating the outputs of the PWM laser drive 200 in accordance with an embodiment of the present disclosure. The graphs 300, 320 and 340 shown in FIGS. 3A-C for illustration only. Other embodiments of the PWM laser drive 200 could produce different outputs without departing from the scope of this disclosure.

For the illustrated embodiment, FIG. 3A is a graph 300 of the outputs with extremely low modulation, e.g., about 3%, FIG. 3B is a graph 320 of the outputs with low modulation, e.g., about 25%, and FIG. 3C is a graph 340 of the outputs with high modulation, e.g., about 75%. When the modulation is extremely low, as shown in the graph 300, the PWM signal 214 peaks for a relatively short time with each cycle. The inverse PWM signal 220b is the inverse of the PWM signal 214. Thus, the inverse PWM signal 220b goes low for a relatively short time. The light energy 218 emitted by the laser diode 206 tracks the peaks in the PWM signal 214 as the laser diode 206 is driven by the drive signal 216 that is generated based on the PWM signal 214. The output drive voltage 212 is shown to be relatively stable over the duration of operation, similar to a DC signal.

Similarly, when the modulation is low, as shown in the graph 320, the PWM signal 214 peaks for a longer, but still short, time with each cycle. The inverse PWM signal 220b thus goes low for the same amount of time. The light energy 218 emitted by the laser diode 206 tracks the peaks in the PWM signal 214. The output drive voltage 212 is again shown to be relatively stable over the duration of operation.

Finally, when the modulation is high, as shown in the graph 340, the PWM signal 214 peaks for a relatively long time with each cycle. The inverse PWM signal 220b thus goes low for the same amount of time. The light energy 218 emitted by the laser diode 206 tracks the peaks in the PWM signal 214. The output drive voltage 212 is again shown to be relatively stable over the duration of operation.

Thus, regardless of the level of modulation provided by the microcontroller 204, the output drive voltage 212 of the PWM laser drive 200 is similar to a DC signal and provides a stable, relatively constant optical power to the laser diode 206.

Figure 4:
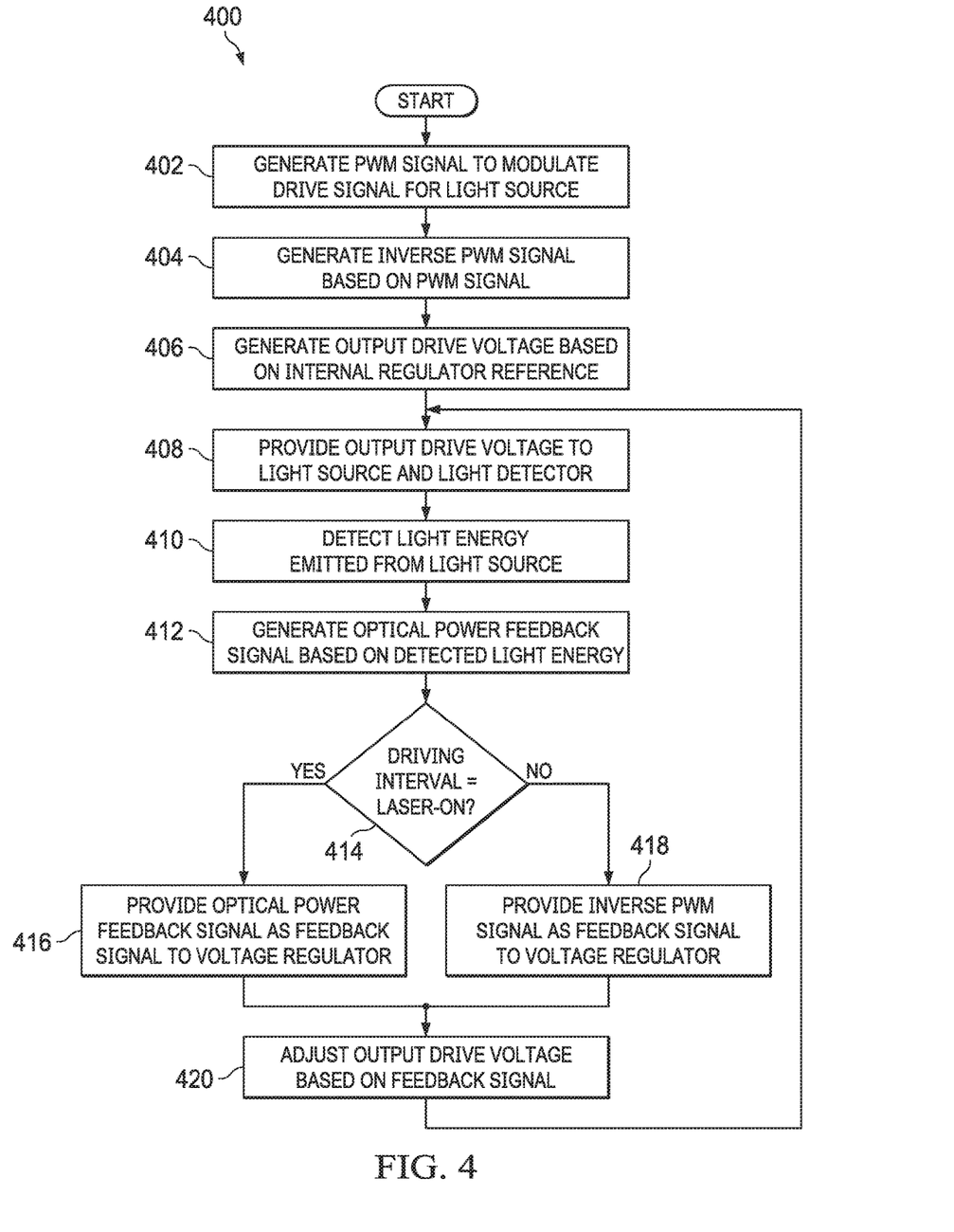
FIG. 4 is a flowchart illustrating a method for driving a light source using the PWM light source drive of FIG. 1 or the PWM laser drive of FIG. 2 in accordance with the present disclosure.

FIG. 4 is a flowchart illustrating a method 400 for driving a light source, such as the light source 106 or the laser diode 206, using the PWM light source drive 100 or the PWM laser drive 200 in accordance with the present disclosure. The method 400 shown in FIG. 4 is for illustration only. A light source may be driven by the PWM light source drive 100 or the PWM laser drive 200 in any other suitable manner without departing from the scope of this disclosure.

Initially, a PWM signal is generated to modulate a drive signal for a light source (step 402). For example, for a particular embodiment, a microcontroller 104 could generate a PWM signal 114 for a modulation element 110, which could generate a drive signal 116 for a light source 106. For another particular embodiment, a microcontroller 204 could generate a PWM signal 214 for a MOSFET 210, which could generate a drive signal 216 for a laser diode 206.

An inverse PWM signal is generated based on the PWM signal (step 404). For example, for a particular embodiment, the microcontroller 104 could generate an inverse PWM signal 120b as an inverse of the PWM signal 114. For another particular embodiment, the microcontroller 204 could generate an inverse PWM signal 220b as an inverse of the PWM signal 214.

An output drive voltage is generated based on an internal regulator reference (and a feedback voltage, as described below) (step 406). For example, for a particular embodiment, a voltage regulator 102 could generate an output drive voltage 112 based on the internal regulator reference for the PWM light source drive 100. For another particular embodiment, a voltage regulator 202 could generate an output drive voltage 212 based on the internal regulator reference for the PWM laser drive 200.

The output drive voltage is provided to a light source and a light detector (step 408). For example, for a particular embodiment, the voltage regulator 102 could provide the output drive voltage 112 to the light source 106 and a bias for a light detector 108. For another particular embodiment, the voltage regulator 202 could provide the output drive voltage 212 to the laser diode 206 and a bias for a photodiode 208.

Light energy emitted from the light source is detected (step 410). For example, for a particular embodiment, the light detector 108 could detect the light energy 118 emitted from the light source 106. For another particular embodiment, the photodiode 208 could detect the light energy 218 emitted from the laser diode 206.

An optical power feedback signal is generated based on the detected light energy (step 412). For example, for a particular embodiment, the light detector 108 could generate an optical power feedback signal 120a based on the detected light energy 118. For another particular embodiment, the photodiode 208 could generate an optical power feedback signal 220a based on the detected light energy 218.

If the current driving interval is a laser-on driving interval (step 414), the optical power feedback signal is provided as a feedback signal to the voltage regulator (step 416). For example, for a particular embodiment, when the drive signal 116 is driving the light source 106 on, the PWM light source drive 100 is in a laser-on driving interval. For this embodiment, during the laser-on driving interval, the optical power feedback signal 120a is provided by the light detector 108 to the voltage regulator 102 as a feedback signal 120. For another particular embodiment, when the drive signal 216 is driving the laser diode 206 on, the PWM laser drive 200 is in a laser-on driving interval. For this embodiment, during the laser-on driving interval, the optical power feedback signal 220a is provided by the photodiode 208 to the voltage regulator 202 as a feedback signal 220.

If the current driving interval is not a laser-on driving interval, i.e., the current driving interval is a laser-off driving interval (step 414), the inverse PWM signal is provided as the feedback signal to the voltage regulator (step 418). For example, for a particular embodiment, when the drive signal 116 is not driving the light source 106 on, the PWM light source drive 100 is in a laser-off driving interval. For this embodiment, during the laser-off driving interval, the inverse PWM signal 120a is provided as the feedback signal 120 to the voltage regulator 102 by the microcontroller 104. For another particular embodiment, when the drive signal 216 is not driving the laser diode 206 on, the PWM laser drive 200 is in a laser-off driving interval. For this embodiment, during the laser-off driving interval, the inverse PWM signal 220a is provided as the feedback signal 220 to the voltage regulator 202 by the microcontroller 204.

The output drive voltage is adjusted, if an adjustment is indicated, based on the feedback signal (step 420). For example, for a particular embodiment, the voltage regulator 102 adjusts the output drive voltage 112 based on the feedback signal 120, which corresponds to the optical power feedback signal 120a during laser-on driving intervals and to the inverse PWM signal 120b during laser-off driving intervals. For another particular embodiment, the voltage regulator 202 adjusts the output drive voltage 212 based on the feedback signal 220, which corresponds to the optical power feedback signal 220a during laser-on driving intervals and to the inverse PWM signal 220b during laser-off driving intervals.

The adjusted output drive voltage is then provided to the light source and the light detector (step 408), and the process continues such that the output drive voltage is monitored and adjusted to be held at a relatively stable level. For example, for a particular embodiment, the voltage regulator 102 generates a relatively stable output drive voltage 112 for the light source 106 based on the feedback provided through the feedback signal 120. For another particular embodiment, the voltage regulator 202 generates a relatively stable output drive voltage 212 for the laser diode 206 based on the feedback provided through the feedback signal 220.

Thus, by synthesizing a feedback signal through the inverse PWM signal during laser-off driving intervals, the output drive voltage may be kept stable during PWM off time without a demanding bandwidth requirement for the voltage regulator. In this way, a range of brightness control may be provided for the light source through a wide dynamic range of modulation.

Although FIG. 4 illustrates one example of a method 400 for driving a light source using the PWM light source drive 100 or the PWM laser drive 200, various changes may be made to the embodiment shown in FIG. 4. For example, while shown as a series of steps, various steps in FIG. 4 could overlap, occur in parallel, occur in a different order, or occur multiple times. As a specific example, steps 402 and 404 may be repeated to generate an adjusted PWM signal 214 and its corresponding inverse PWM signal 220b if the duty cycle is changed through the use of the up switch 234 or the down switch 236.

Modifications, additions, or omissions may be made to the apparatuses, and methods described herein without departing from the scope of the disclosure. For example, the components of the apparatuses may be integrated or separated. The methods may include more, fewer, or other steps. Additionally, as described above, steps may be performed in any suitable order.

It may be advantageous to set forth definitions of certain words and phrases used throughout this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The term "each" refers to each member of a set or each member of a subset of a set. Terms such as "over" and "under" may refer to relative positions in the figures and do not denote required orientations during manufacturing or use. Terms such as "higher" and "lower" denote relative values and are not meant to imply specific values or ranges of values. The phrases "associated with" and "associated therewith," as well as derivatives thereof, may mean to include, be included within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A pulse-width modulation (PWM) light source drive for driving a light source, comprising:
    a microcontroller configured to generate a PWM signal and an inverse PWM signal;
    a modulation element configured to generate a drive signal based on the PWM signal, wherein the light source is configured to be driven by the drive signal;
    a voltage regulator configured to generate an output drive voltage for the light source; and a light detector configured to detect light energy emitted by the light source, to generate an optical power feedback signal based on the detected light energy, and to provide the optical power feedback signal to the voltage regulator during a light source-on driving interval, wherein the microcontroller is further configured to provide the inverse PWM signal to the voltage regulator during a light source-off driving interval, and wherein the voltage regulator is further configured to adjust the output drive voltage based on the optical power feedback signal during the light source-on driving interval and based on the inverse PWM signal during the light source-off driving interval.

2. The PWM light source drive of claim 1, wherein the voltage regulator comprises a switching type or a linear type.

3. The PWM light source drive of claim 1, wherein the light source comprises a light-emitting diode.

4. The PWM light source drive of claim 1, wherein the light detector comprises a photodiode.

5. The PWM light source drive of claim 1, wherein the modulation element comprises a transistor.

6. The PWM light source drive of claim 1, wherein the modulation element comprises a metal-oxide-semiconductor field-effect transistor.

7. The PWM light source drive of claim 1, further comprising the light source.

8. A pulse-width modulation (PWM) laser drive for driving a laser diode, comprising:

a microcontroller configured to generate a PWM signal and an inverse PWM signal;

a modulation element configured to generate a drive signal based on the PWM signal, wherein the laser diode is configured to be driven by the drive signal;

a voltage regulator configured to generate an output drive voltage for the laser diode based on an internal regulator reference; and a photodiode configured to detect light energy emitted by the laser diode, to generate an optical power feedback signal based on the detected light energy, and to provide the optical power feedback signal to the voltage regulator during a laser-on driving interval, wherein the microcontroller is further configured to provide the inverse PWM signal to the voltage regulator during a laser-off driving interval, and wherein the voltage regulator is further configured to adjust the output drive voltage based on the optical power feedback signal during the laser-on driving interval and based on the inverse PWM signal during the laser-off driving interval.

9. The PWM laser drive of claim 8, wherein the voltage regulator comprises a switching type or a linear type.

10. The PWM laser drive of claim 8, wherein the modulation element comprises a transistor.

11. The PWM laser drive of claim 8, wherein the modulation element comprises a metal-oxide-semiconductor field-effect transistor.

12. The PWM laser drive of claim 8, further comprising the laser diode.

13. The PWM laser drive of claim 8, wherein the PWM signal comprises a 10-bit resolution duty cycle.

14. A method for driving a light source using a pulse-width modulation (PWM) light source drive, comprising:

modulating a drive signal for the light source with a PWM signal;

generating an inverse PWM signal based on the PWM signal;

generating an output drive voltage based on an internal regulator reference;

providing the output drive voltage to the light source;

detecting light energy emitted from the light source;

generating an optical power feedback signal based on the detected light energy;

providing the optical power feedback signal as a feedback signal when a current driving interval is a light source-on driving interval;

providing the inverse PWM signal as the feedback signal when the current driving interval is a light source-off driving interval; and adjusting the output drive voltage based on the feedback signal.

15. The method of claim 14, wherein generating an output drive voltage comprises generating the output drive voltage with a voltage regulator, wherein adjusting the output drive voltage comprises adjusting the output drive voltage with the voltage regulator, and wherein the voltage regulator comprises a switching type or a linear type.

16. The method of claim 14, wherein the light source comprises a laser diode.

17. The method of claim 14, further comprising providing the output drive voltage to a light detector as a bias voltage, wherein the light detector comprises a photodiode.

18. The method of claim 14, further comprising driving the light source with a modulation element, wherein the modulation element comprises a transistor.

19. The method of claim 18, wherein the transistor comprises a metal-oxide-semiconductor field-effect transistor.

20. The method of claim 14, wherein the PWM signal comprises a 10-bit resolution duty cycle.

* * * * *